United States Patent
Chan et al.

(10) Patent No.: US 7,026,718 B1
(45) Date of Patent: Apr. 11, 2006

(54) STACKED MULTI-COMPONENT INTEGRATED CIRCUIT MICROPROCESSOR

(75) Inventors: Tsiu Chiu Chan, Carrollton, TX (US); Arnaud Lepert, Montbonnot (FR); Lawrence Philip Eng, Dallas, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/160,824

(22) Filed: Sep. 25, 1998

(51) Int. Cl.
    *H01L 23/48* (2006.01)

(52) U.S. Cl. ............ 257/777; 257/723; 257/724; 257/778; 257/780; 257/784

(58) Field of Classification Search ......... 257/777–778, 257/780–782, 784–787; 361/772, 777, 779, 361/784, 790
See application file for complete search history.

(56) References Cited

U.S. PATENT DOCUMENTS

| | | | |
|---|---|---|---|
| 4,774,632 A | 9/1988 | Neugebauer | 361/386 |
| 5,019,673 A | 5/1991 | Juskey et al. | 174/52.2 |
| 5,093,708 A | 3/1992 | Solomon | 357/68 |
| 5,107,586 A | 4/1992 | Eichelberger et al. | 29/830 |
| 5,122,691 A | 6/1992 | Balakrishnan | 307/475 |
| 5,217,914 A | 6/1993 | Matsumoto et al. | 437/47 |
| 5,265,045 A | 11/1993 | Nishio et al. | 365/63 |
| 5,346,857 A | 9/1994 | Scharr et al. | 437/183 |
| 5,377,077 A | 12/1994 | Burns | 361/704 |
| 5,399,898 A | 3/1995 | Rostoker | 257/499 |
| 5,454,160 A | 10/1995 | Nickel | 29/840 |
| 5,477,067 A * | 12/1995 | Isomura et al. | 257/211 |
| 5,650,977 A | 7/1997 | Kyung et al. | 368/230.03 |
| 5,677,567 A * | 10/1997 | Ma et al. | 257/666 |
| 5,869,895 A * | 2/1999 | Raad | 257/723 |
| 6,150,724 A * | 11/2000 | Wenzel et al. | 257/777 |
| 6,255,736 B1 * | 7/2001 | Kaneko | 257/777 |

FOREIGN PATENT DOCUMENTS

EP    253295 A1 * 7/1987

OTHER PUBLICATIONS

U.S. Appl. No. 148,857. Japan.
U.S. Appl No. 137,655. Japan.
U.S. Appl. No. 224,154. Japan.
U.S. Appl. No. 155,162. Japan.
U.S. Appl. No. 127, 856. Japan.
U.S. Appl. No. 117,252. Japan.
U.S. Appl. No. 117,251. Japan.
U.S. Appl. No. 117,146. Japan.
U.S. Appl. No. 248,541. Japan.
U.S. Appl. No. 216,455. Japan.
U.S. Appl. No. 99,362. Japan.
U.S. Appl. No. 42,942. Japan.
U.S. Appl. No. 35,546. Japan.
U.S. Appl. No. 269,352. Japan.
U.S. Appl. No. 90,959. Japan.
U.S. Appl. No. 90,957. Japan.

(Continued)

*Primary Examiner*—Minhloan Tran
*Assistant Examiner*—Thomas L Dickey
(74) *Attorney, Agent, or Firm*—Lisa K. Jorgenson; William A. Munck

(57) ABSTRACT

An apparatus and method for fabricating a microprocessor comprising a first chip (12) having an active face (30) including a central processing unit and a second chip (14) having an active face (32) electrically connected to the active face of the first chip (12), wherein the second chip (14) provides added functionality to the central processing unit of the first chip (12) and wherein the electrical connections (16, 18) are through bonding layers (28) that are in contact with the metalization 26 on the first and second chips (12, 14), is disclosed.

16 Claims, 1 Drawing Sheet

OTHER PUBLICATIONS

U.S. Appl. No. 90,937. Japan.
U.S. Appl. No. 304,655. Japan.
U.S. Appl. No. 283,149. Japan.
U.S. Appl. No. 84,741. Japan.
U.S. Appl. No. 61,029. Japan.
U.S. Appl. No. 50,551. Japan.
U.S. Appl. No. 278,893. Japan.
U.S. Appl. No. 207,562. Japan.
U.S. Appl. No. 129,955. Japan.
U.S. Appl. No. 62,069. Japan.
U.S. Appl. No. 5,540. Japan.
U.S. Appl. No. 5,455. Japan.
U.S. Appl. No. 276,751. Japan.
U.S. Appl. No. 276,750. Japan.
U.S. Appl. No. 266,454. Japan.
U.S. Appl. No. 231,450. Japan.
U.S. Appl. No. 173,170. Japan.
U.S. Appl. No. 169,062. Japan.
U.S. Appl. No. 69,150. Japan.
U.S. Appl. No. 44, 955. Japan.
U.S. Appl. No. 6,263. Japan.
U.S. Appl. No. 201,475. Japan.
U.S. Appl. No. 368,167. Japan.
U.S. Appl. No. 364,052. Japan.
U.S. Appl. 274,356. Japan.
U.S. Appl. No. 356,352. Japan.
U.S. Appl. No. 180,257. Japan.
U.S. Appl. No. 158,165. Japan.
U.S. Appl. No. 116, 861. Japan.
U.S. Appl. No. 76,946. Japan.
U.S. Appl. No. 62,961. Japan.
U.S. Appl. No. 61,152. Japan.
U.S. Appl. No. 48, 768. Japan.
U.S. Appl. 160,325. Japan.
U.S. Appl. No. 129,517. Japan.
U.S. Appl. No. 129,516. Japan.
U.S. Appl. No. 90,486. Japan.
U.S. Appl. No. 55,451. Japan.
U.S. Appl. No. 48,001. Japan.
U.S. Appl. No. 13,667. Japan.
U.S. Appl. No. 13,663. Japan.
U.S. Appl. No. 283,607. Japan.
U.S. Appl. No. 259,378. Japan.
U.S. Appl. No. 243,482. Japan.
U.S. Appl. No. 183,102. Japan.
U.S. Appl. No. 183,010. Japan.
U.S. Appl. No. 167,004. Japan.
U.S. Appl. No. 172,402. Japan.
U.S. Appl. No. 112,401. Japan.
U.S. Appl. No. 21,328. Japan.
U.S. Appl. No. 5,776. Japan.
U.S. Appl. No. 350,025. Japan.
U.S. Appl. No. 302,762. Japan.
U.S. Appl. No. 241,889. Japan.
U.S. Appl. No. 188,362. Japan.
U.S. Appl. No. 188,280. Japan.
U.S. Appl. No. 150,031. Japan.
U.S. Appl. No. 132,474. Japan.
U.S. Appl. No. 211,758. Japan.
U.S. Appl. No. 169,909. Japan.
U.S. Appl. No. 78,938. Japan.
U.S. Appl. No. 307,437. Japan.
U.S. Appl. No. 221,135. Japan.
U.S. Appl. No. 264,712. Japan.
U.S. Appl. No. 167,703. Japan.
U.S. Appl. No. 125,112. Japan.
U.S. Appl. No. 152,979. Japan.
U.S. Appl. No. 55,390. Japan.
U.S. Appl. No. 17,945. Japan.
U.S. Appl. No. 17,913. Japan.

* cited by examiner

STACKED MULTI-COMPONENT INTEGRATED CIRCUIT MICROPROCESSOR

TECHNICAL FIELD OF THE INVENTION

This invention relates, in general, to the field of integrated circuits and, more particularly, to an apparatus and method for assembling integrated circuit microprocessors in a compact structure that maximizes spacial and manufacturing efficiency.

BACKGROUND

During the manufacture of integrated circuits, the processing of the semiconductor layers that form the circuitry of the integrated circuit is one of the most critical steps. In fact, as integrated circuit processor designs increase in complexity, the need to maximize the yield at every layering step becomes increasingly important.

Heretofore in this field, electronic systems such as computers, cellular telephones, etc., were built with individual components that were assembled on a circuit board. For example, an electronic system such as a computer generally includes a microprocessor, an input/output or bus interface, a memory cache, keyboard control circuits, video circuits, and a floppy disk drive, hard disk drive and/or CD-ROM control circuits. The central component of the electronic system is the processor, now generally called a microprocessor to indicate the decreasing size of the individual electronic components.

Using the microprocessor that forms part of the electronic system, as an example, it can be observed that the following evolution has occurred. The creation of the logic that forms the main component of the microprocessor on a single silicon substrate was a first step. A second step was to decrease the distance between the logic of the processor and the bit buffering components that the microprocessor uses to control processor flow by creating a single chip containing the microprocessor and a cache memory. A third step was the integration of a microprocessor, cache memory and an input/output bus interface, also on a single chip.

United States Letters Patent No. 5,561,594, issued Oct. 1, 1996 (SGS-Thomson Microelectronics, Ltd.) discloses an electrical assembly in which the electrical component is mounted on a multi-layer printed circuit board having a plurality of conducting pins located in perforations within the board. The conducting pins located in the board have pointed ends that project above the board and make electric contact with solder bumps on the electrical component. The specification describes an apparatus and method for flip-chip packaging. As with conventional manufacturing, the printed circuit board has standard size vias that are drilled through for each individual substrate.

United States Letters Patent No. 5,621,193, issued Apr. 15, 1997 (Northrop Grumman Corp.) discloses a method for electrically connecting surface conductors to edge conductors by use of an intersecting side non-conductor substrate having a through hole in the substrate and metalization of the through hole. The electrical connections between the surface and the side include forming an intersecting ceiling plug in the via prior to cutting the intersecting side.

SUMMARY OF THE INVENTION

It has been recognized herein that a need has arisen for a simple, effective apparatus and method for providing a high frequency microprocessor that can be developed using present processing equipment, materials and techniques. The need has also arisen for a more versatile microprocessor design for medium to high performance semiconductors, using current substrates and methods of manufacturing substrates with increased efficiency and decreased cost. Furthermore, a need has arisen for a substrate that can be made using present equipment and using standard manufacturing techniques, but which decreases the total number of layers deposited and etched on a monolithic substrate.

The present invention provides a simple, effective apparatus and method for designing, producing and packaging high performance ultra large scale integration (ULSI) semiconductor integrated circuits. The present invention can increase the efficiency of the production in manufacture of semiconductor integrated circuits. The present invention can also decrease the processing time and materials needed to manufacture ULSI semiconductor integrated circuits.

One embodiment of the present invention is a microprocessor including a first integrated circuit chip, having an active face including a central processing unit, and a second integrated circuit chip electrically connected to the active face of the first integrated circuit chip. The second integrated circuit chip provides added functionality to the central processing unit of the first integrated circuit chip. Examples of central processing units for use with the present invention are digital signal processors or field programmable gate arrays.

The second integrated circuit chip adds functionality to the first integrated circuit chip by, for example, providing accessible memory or a cache, such as a level 1 or 2 cache, at a short distance without the need for long routing lines within the substrate of the first integrated circuit chip. Examples of memory chips that can be used include but are not limited to: DRAM, SRAM or FLASH. Alternatively, the second integrated circuit chip can be an analog-to-digital converter or a digital-to-analog converter.

More particularly, the present invention has a first integrated circuit chip that is used as a base to support another integrated circuit chip, such as a memory circuit. A third integrated circuit chip may also be disposed adjacent to the second integrated circuit chip. In one embodiment, the second integrated circuit is "piggybacked" onto the first integrated circuit by flipping it so that the active components of the integrated circuit are exposed and available to make contact with the first integrated circuit chip.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

Figure 1:
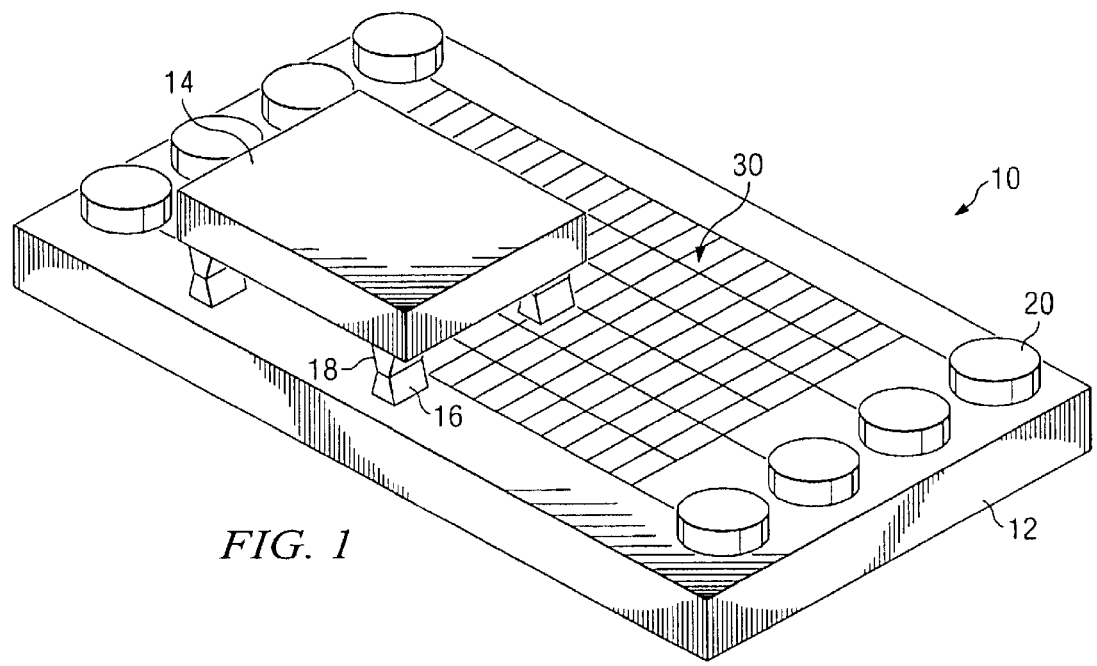
FIG. 1 is an isometric view of a microprocessor of the present invention.

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

Integration of ultra large scale integrated (ULSI) circuits comes in the form of, for example, the Cyrix 6×86MX. This integrated microprocessor incorporates the following electronic components into a single chip: a Bus interface, a memory management unit, a control unit, code and data cache, line cache, prefetching IF, instruction decode, v- and u-pipes, Registers, a floating processor unit and other components.

The large scale integration of ULSI components has led to a number of packaging problems and limitations. One such case is the embedding of a large memory core (like a DRAM) in a microprocessor or other processing logic such as field programmable gate arrays (FPGA), one example of which is a large application specific integrated circuit (ASIC) or subsystem. To integrate these different electronic components, the chip must be manufactured using a diverse mix of integrated circuit processing technologies, namely, those to manufacture a processor and those to manufacture memory. As the different electronic components of the processor require deposition of different layers, materials, etching, etc., on a single wafer, the problem of integrating a larger number of electronic components having smaller electrical components is increased geometrically. For a microprocessor, one example of combination processing is the formation of DRAM followed by the formation of ASIC components. Similar examples include the combination of a FLASH or SRAM memory formation process, followed by an ASIC process or vice-versa. Unfortunately, this mixing of technologies requires a compromise from each of the components used.

For example, a DRAM process that is specifically customized for creating DRAM cells, presently requires 2–4 polysilicon layers and typically 1–2 metal layers. An SRAM forming process will be customized accordingly, requiring 2–4 polysilicon layers and 2–3 metal layers. An ASIC process is one designed to support microprocessors specifically built for a particular logic and can be composed of 1 polysilicon and 4–5 metal layers. A combination of such electronic components, even when maximizing the efficiency of embedding like components of a DRAM and microprocessor unit, requires from between 2 to 4 poly silicon layers and 4 to 5 metal layers. To satisfy the requirements necessary to build a DRAM memory cell including the extensive interconnections, requires, at this level of integration, to route multiple address lines and data busses from the many cells to the microprocessor.

The present inventors have recognized the limitations of cost and performance of merging the functions of a microprocessor and, e.g., DRAM, SRAM or embedding memories on a single monolithic chip. The problem can be further illustrated by the use of multi-chip carriers for the Pentium microprocessor or the circuit board for the Pentium II in which all the electronic components are embedded in a single monolithic chip.

While a number of processing solutions have provided cost-effective methods to produce higher levels of integrations on a single chip, combination microprocessors have reduced performance over what could otherwise be obtained from a monolithic solution, if such were available.

Turning now to the present invention, FIG. 1 is an isometric view of an integrated circuit microprocessor generally depicted as 10. The integrated circuit microprocessor 10 has a first integrated circuit chip 12, shown here with the active components 30 and the backside of the silicon not having any active circuit disposed thereon face down. The amount and types of electronic circuits that are disposed as active components 30 integral with integrated circuit chip 12 will depend on the specific logic processor required. Types of integrated circuits that may be used include the logic necessary to provide a central processing unit, such as, a digital signal processor or an ASIC processor.

A second integrated circuit chip 14 is depicted connected to integrated circuit chip 12. Extending from the integrated circuit chip 12, and being integral therewith, are electrical contacts 16. Electrical contacts 16 generally rise from the integrated circuit chip 12 surface and are used to connect active components 30 of the integrated circuit chip 12 with active components (not depicted) integral with the second integrated circuit chip 14. One aspect of the present invention that is apparent from the isometric view is that the distance between connections among active components on the chips 12 and 14 is greatly reduced by not having a connector, such as wire bonding or solder balls or columns between the first and second integrated circuit chips 12, 14. The distance between the chips 12, 14 can be about that of a micro-solder ball. Generally, solder balls range in size from about 8 to 200 microns in thickness.

The electrical contacts 16 form an electrical connection with the electrical contacts 18 of integrated circuit chip 14, e.g., by bump bonding or by solder reflow of metalization layers (described hereinbelow). The electrical contacts 18 of the second integrated circuit chip 14 can also be integral with the second integrated circuit chip 14 and electrically connect to its active components. Finally, disposed on the same surface of the integrated circuit chip 12 as the electrical contacts 16, are pads 20 that serve to connect the integrated circuit microprocessor 10 with a mother or sister-board.

Figure 2:
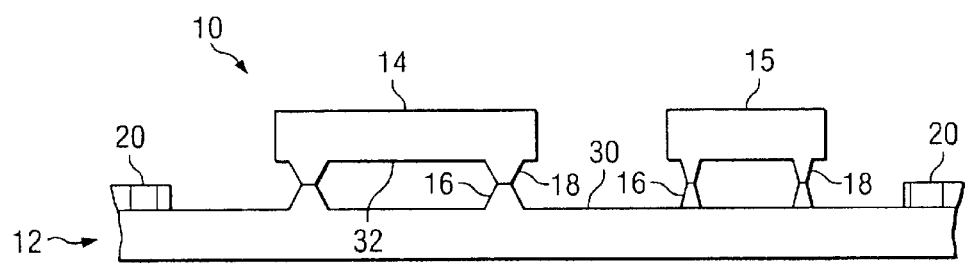
FIG. 2 is a side view of a microprocessor according to another embodiment of the present invention.

FIG. 2 is a cross-sectional side view of an integrated circuit microprocessor 10 made in accordance with the present invention. In order to provide for the electrical connection of the integrated circuit microprocessor 10, the pads 20 are located so as to permit the deposition of solder balls, solder columns or connection by wire bonding for connection with, e.g., a printed circuit board such as a mother or sister board. To do so, the size of the second integrated circuit chip 14 is less than the size of the integrated circuit chip 12. Alternatively, the second integrated circuit chip 14 can be offset sufficiently from the top surface of the integrated circuit chip 12 to provide for an opening through which connections from pads 20 may be made.

As seen from the side view of FIG. 2, the electrical contacts 16 and 18 are integral with the integrated circuit chips 12, 14 and 15. The electrical contacts 16, 18 are disposed on the face containing active components. 30 and 32 of the chips 12, 14 and 15. By positioning integrated circuit chips 14 and 15 in such close proximity to the active components of the integrated circuit chip 12, the distance that electrical signals must travel between active components 30 and 32 is greatly reduced in comparison to placing the equivalent circuit on real estate adjacent the processor logic on a monolithic chip. Furthermore, the number of reroute lines, such as route address lines and data bus lines, occupying real estate on the active surface of the chip 12 and chips 14 and 15 are reduced.

Also, by positioning a separate integrated circuit that adds functionality to the first integrated circuit, such as providing additional local FLASH memory, an L1 or L2 cache, or a digital-to-analog converter, the ancillary or complementary features and functionality of integrated circuit microprocessor 10 can be changed without having to completely redesign the active components of the microprocessor. For example, different memory capacities can be positioned on the integrated circuit chip 12 through contacts designed at the same position.

The present invention maximizes the efficiency of the creation of the individual components of a microprocessor by permitting the manufacturer to optimize the processing steps, and consequently the quality, of the different components. For example, the first integrated circuit chip 12 can have disposed thereon only a central processing unit. Memory that is rapidly accessible to the central processing unit can be disposed directly thereon in the form of the second integrated circuit chip 14, as can other functionalities such as audio or video processors.

Yet another advantage of the present invention is the m recognition that the components that make up these "ancillary" functionalities can change over time. The present invention permits for the rapid replacement, in the microprocessor assembly line, of old outdated components for new components. The replacement of ancillary components can occur without the need to change the original design of the integrated circuit microprocessor to accommodate the new functionality. The present invention also eliminates the need to completely redesign the entire surface of a monolithic fully integrated chip as is presently done, as the new updated components can be piggy-backed directly on chips with pre-existing designs.

A problem with variable heating within combination microprocessors on monolithic chips has been encountered. By using separate integrated circuit units, the variance in the power requirements and, consequently, the heat production of a single monolithic chip, having a wide array of different functionalities, may be reduced.

Figure 3:
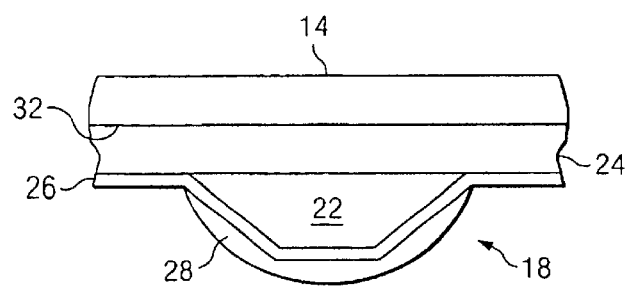
FIG. 3 is a close-up side view of a microprocessor contact.

FIG. 3 is a close-up of one electrical contact 18 for use with the present invention. The active components 32 of the integrated circuit chip 14 are depicted in this cross-section as separated by a dielectric or electrically insulative layer 24. Disposed on the insulative layer 24 is patterned a metalization layer 26 that provides for isolated electrical contacts between the integrated circuit chips 12 and 14. The metalization layer 26 connects to the active components 32 of chip 14 by having an electrical connection (not depicted) that crosses insulative layer 24. To provide an integral contact, a rise 22 that is either insulative or conductive, can be deposited on the insulative layer 24. The rise 22 can also be coated with the metalization 26. Finally, a bonding layer 28 can be disposed on the metalization 26. The deposited bonding layer 28 (as opposed to adding connectors such as wire bonding or solder balls) can be, e.g., gold, tin, iridium, copper, or combinations thereof. The bonding layer 28 provides a direct connection of metalization layers 26 on the active faces of the integrated circuit chips by having an electrical contact between the electrical contacts 16 and 18. By a direct connection it is meant that the connection between metalization 26 and the adjacent integrated circuit chip does not require and intermediate electrically conductive component, e.g., a solder ball. The bonding layer 28 can also be thermocompressible to provide for a mechanical bond between the contacts 16 and 18. The mechanical bond helps to retain, e.g., the second integrated circuit chip 14 on the integrated circuit chip 12, whether or not the integrated circuit chips 12 and 14 are further packaged or encapsulated.

The invention disclosed here allows for optimization of cost and performance of individual components to develop an electronic system or sub-system. Accordingly, in one embodiment the present invention includes combining a microprocessor with a separate memory, such as DRAM. The microprocessor can be manufactured in a process with a high level of interconnects, such as having 4 to 5 metal layers. Likewise, memory can be produced and the process of its production optimized.

The present invention has the following advantages. First, it combines two or more integrated circuits into a more compact structure over chip carriers (packaging solutions) or printed circuit boards. It also allows individual components, such as the microprocessor's CPU and the memory or cache, to be manufactured using processes and technology that optimize the speed, performance and cost of that component. Furthermore, the invention allows higher integration of components that otherwise might be limited.

The present inventors have solved the problem posed by the limits imposed by the monolithic embedding of circuits, such as embedded applications. By emphasizing the efficiency of production of individual components the assembly process need only be expanded to support the packaging requirements of the individual components.

The present invention also improves the performance of the functional components that comprise the overall microprocessor by eliminating packaging or wiring delays by having direct contact between the integrated circuit processor and ancillary components. It is expected that using the present invention, high frequencies in the 500 Megahertz to 7 Gigahertz can be supported and achieved.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A microprocessor comprising:
    a first integrated circuit chip having an active face including a central processing unit; and
    a second integrated circuit chip mounted on, and electrically connected to, the active face of the first integrated circuit, wherein the second integrated circuit chip provides added functionality to the central processing unit of the first integrated circuit,
    wherein at least one metal region projecting from the active face of the first integrated circuit chip overlies at least one metal region projecting from a surface of the second integrated circuit chip, and
    wherein the second integrated circuit chip is spaced apart from the first integrated chip by a distance of at least a projection height of the at least one metal region projecting from the active face of the first integrated circuit chip plus a projection height of the at least one metal region projecting from the surface of the second integrated circuit chip, wherein the distance is sufficient to permit electrical connection to contact pads on the active surface of the first integrated circuit chip for external connection to the central processing unit.

2. The microprocessor of claim 1, wherein the central processing unit comprises one of a digital signal processor and a field programmable gate array.

3. The microprocessor of claim 1, wherein an active face of the second integrated circuit chip faces the active face of the first integrated circuit chip.

4. The microprocessor of claim 1, wherein the second integrated circuit chip comprises one of a memory and an analog-to-digital converter.

5. The microprocessor of claim 4, wherein the second integrated circuit comprises one of a cache memory, a dynamic random access memory (DRAM), a static random access memory (SRAM), and a flash memory.

6. The microprocessor of claim 1, further comprising:
a bonding layer between and electrically connecting the at least one metal region projecting from the active face of the first integrated circuit chip and the at least one metal region projecting from a surface of the second integrated circuit chip, wherein the bonding layer provides mechanical bonding of the first and second integrated circuit chips.

7. The microprocessor of claim 1, further comprising:
at least two groups of contact pads on the active surface of the first integrated circuit chip for external connection to the central processing unit, wherein the second integrated circuit chip has a width less than a distance between the two groups of contact pads.

8. The microprocessor of claim 1, further comprising:
a third integrated circuit chip mounted on, and electrically connected to, the active face of the first integrated circuit adjacent the second integrated circuit chip, wherein the third integrated circuit chip adds further functionality to the central processing unit of the first integrated circuit.

9. The microprocessor of claim 1, wherein the electrical connection between the first integrated circuit chip and the second integrated circuit chip is by direct connection of metal regions on the active faces of the first and second integrated circuit chips by a bonding layer.

10. The microprocessor of claim 1, wherein a length and width of the second integrated circuit chip are less than a respective length and width of the first integrated circuit chip.

11. A microprocessor comprising:
a first chip having an active face including a central processing unit; and
a second chip having an active face, the second chip mounted on, and electrically connected to, the active face of the first chip, wherein the second chip adds functionality to the central processing unit of the first chip and wherein the electrical connection is by a bonding layer between metal regions on the active faces of the first and second chips, and wherein at least one of the metal regions on the active surface of the first chip is disposed over a portion of an integrated circuit forming the central processing unit.

12. The microprocessor of claim 11, wherein the metal regions further comprise one of:
conductive regions projecting from the active faces of the first and second chips; and
conductive layers over insulating regions projecting from the active faces of the first and second chips,
wherein the active regions of the first and second chips are spaced apart by the metal regions.

13. The microprocessor of claim 11, wherein the central processing unit comprises one of a digital signal processor and a field programmable gate array.

14. The microprocessor of claim 11, wherein the second chip comprises one of a memory and an analog-to-digital converter.

15. The microprocessor of claim 11, further comprising:
a third chip mounted on, and electrically connected to, the active face of the first chip adjacent the second chip wherein the third chip adds further functionality to the central processing unit of the first chip.

16. The microprocessor of claim 11, wherein a width of the second integrated circuit chip is less than a width of the first integrated circuit chip.

* * * * *